(12) United States Patent
Chan et al.

(10) Patent No.: US 7,433,666 B2
(45) Date of Patent: Oct. 7, 2008

(54) DUAL RECEIVE FILTER

(75) Inventors: Wen-Yen Chan, Thornhill (CA); Nasserullah Khan, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 494 days.

(21) Appl. No.: 11/120,948

(22) Filed: May 4, 2005

(65) Prior Publication Data

US 2006/0154635 A1 Jul. 13, 2006

Related U.S. Application Data

(60) Provisional application No. 60/642,551, filed on Jan. 11, 2005.

(51) Int. Cl.
*H04B 1/10* (2006.01)

(52) U.S. Cl. .......... 455/304; 455/63.1; 455/67.13; 455/307; 455/552.1

(58) Field of Classification Search .......... 455/63.1, 455/67.11, 67.13, 232.1, 295, 296, 303, 304, 455/305, 306, 307, 552.1, 553.1
See application file for complete search history.

(56) References Cited

U.S. PATENT DOCUMENTS

| 5,335,363 | A | 8/1994 | Basciano | |
|---|---|---|---|---|
| 6,166,599 | A | 12/2000 | Aparin et al. | |
| 6,606,483 | B1 * | 8/2003 | Baker et al. | 455/126 |
| 6,785,324 | B1 | 8/2004 | Schultz et al. | |
| 6,859,097 | B2 * | 2/2005 | Chandler | 330/107 |
| 2005/0107051 | A1 | 5/2005 | Aparin et al. | |

FOREIGN PATENT DOCUMENTS

EP  1 379 007 A2  1/2004

OTHER PUBLICATIONS

Exam Report from Australian Patent Office for Singapore patent application No. SG200605223-7, date of mailing Jul. 19, 2007.
International Preliminary Report on Patentability (IPRP) for PCT patent application No. PCT/CA2005/000681 date of mailing Jul. 26, 2007.
Written Opinion for PCT patent application No. PCT/CA2005/000681 date of mailing Oct. 5, 2005.
Supplementary European Search Report for EP patent application No. EP 05742541 dated Dec. 13, 2006.

(Continued)

*Primary Examiner*—Quochien B Vuong
(74) *Attorney, Agent, or Firm*—Bereskin & Parr (57) ABSTRACT

A pre-processing stage is provided for a receiver of a wireless device. The pre-processing stage includes an amplifier that receives signals of interest and unwanted signals and produces amplified signals of interest and amplified unwanted signals, and a matching network that separates the amplified signals of interest from the amplified unwanted signals in conjunction with additional downstream filters. The preprocessing stage also includes a signal path that includes components for receiving and pre-processing the amplified signals of interest, and a shunt path that includes components for adjusting reflected energy sent back to the amplifier for limiting the output swing of the amplifier in a frequency band corresponding to the amplified unwanted signals.

16 Claims, 3 Drawing Sheets

OTHER PUBLICATIONS

Written Opinion from Australian Patent Office for Singapore patent application No. SG 200605223-7, date of mailing Oct. 23, 2006.
International Search Report for PCT/CA2005/00681 dated Oct. 5, 2005.

European Examination Report for EP patent application No. EP 05742541 dated Dec. 28, 2007.

* cited by examiner

DUAL RECEIVE FILTER

REFERENCE TO RELATED APPLICATION

This application claims priority from U.S. Provisional Patent Application Ser. No. 60/642,551 filed on Jan. 11, 2005.

FIELD

Embodiments described herein relate generally to wireless communications devices and more particularly to a receiver structure for wireless communications devices.

BACKGROUND

In a wireless device, such as a mobile phone, the linearity of the amplifiers and mixers in the transceiver portion of the wireless device is important. Without sufficient linearity the received signals of interest can become distorted if they are strong or may be masked by out of band noise when they are weak. A partial solution is to pre-filter the received signal before the low noise amplifiers (LNA) in the receiver portion of the transceiver. However, in full duplex radio systems, in which the data may be simultaneously received and transmitted by the transceiver, substantial transmitter power may leak from the transmitter portion of the transceiver into the receiver portion of the receiver such that the transmission signal passing through the receiver portion of the transceiver can be millions of times stronger than the received signals of interest.

To address the full duplex issue, one conventional approach is to isolate the transmitter portion of the duplexer from the receiver portion of the duplexer to prevent the power from the transmitted signals from disrupting the receiver portion of the duplexer. Unfortunately, the most advanced duplexers and receiver filters conventionally used sometimes do not have enough isolation to compensate for the non-linearity of the LNAs and the mixers that are used in the receiver portion of the transceiver. Further such an approach may result in a degradation of the noise figure for the receiver portion of the transceiver.

To further address this issue, tradeoffs can be made when designing the LNA used in the receiver. For instance, tradeoffs can be made when selecting the LNA's noise figure (NF), gain, linearity, stability and power consumption. However, certain conventional LNAs may have a poor design that does not have good linearity or stability. For instance, some conventional designs may trade off too much NF and gain to achieve better linearity.

BRIEF DESCRIPTION OF THE FIGURES

For a better understanding of a portion of a receiver that may be used in a transceiver of a wireless device and to show more clearly how it may be carried into effect, reference will now be made, by way of example only, to the accompanying drawings which show at least one exemplary embodiment and in which.

DETAILED DESCRIPTION

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein, but rather as merely describing the implementation of the various embodiments described herein.

The embodiments relate to a portion of a receiver that may be applied to a wireless communications device. A wireless communications device is a two-way communications device with advanced data communication capabilities having the capability to communicate with other computer systems. The wireless communications device may also include the capability for voice communications. Depending on the functionality provided by the wireless communications device, it may be referred to as a data messaging device, a two-way pager, a cellular telephone with data messaging capabilities, a wireless Internet appliance, or a data communications device (with or without telephony capabilities). The wireless communications device communicates with other devices through a network of transceiver stations.

Figure 1:
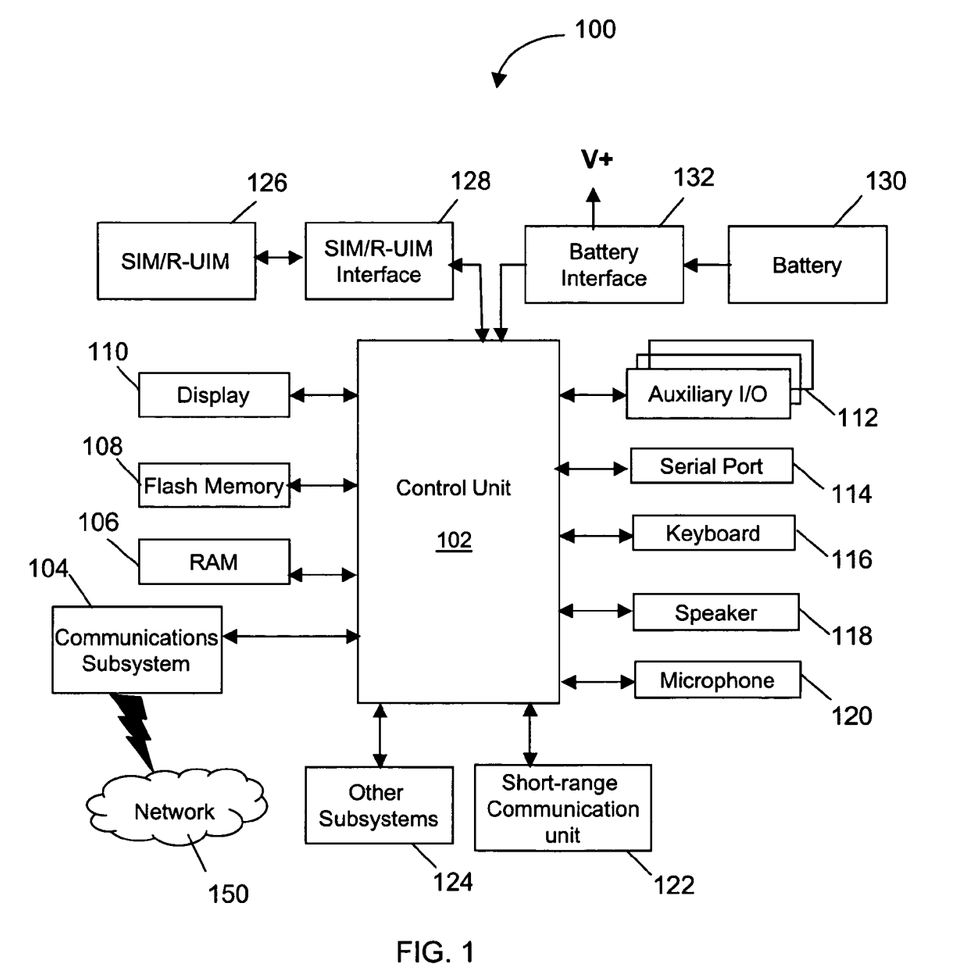
FIG. 1 is a block diagram of an exemplary embodiment of a wireless communications device.

Referring first to FIG. 1, shown therein is a block diagram of an exemplary embodiment of a wireless communications device 100 which may also be referred to as a mobile communications device. The wireless communications device 100 comprises a number of components, such as a control unit 102 which controls the overall operation of the wireless communications device 100. The control unit 102 may be a microprocessor or a microcontroller. Any commercially available microcontroller, such as a microcontroller available from ARM, Motorola, Intel and the like may be used for the control unit 102.

Communication functions, including data and possibly voice communications, are performed through the communications subsystem 104. The communications subsystem 104 receives messages from and sends messages to a wireless network 150. In one embodiment, the communications subsystem 104 may be configured in accordance with cdma2000 standards, or with Global System for Mobile Communication (GSM) and General Packet Radio Services (GPRS) standards. The GSM/GPRS wireless network is used worldwide and it is expected that these standards will eventually be superseded by the Enhanced Data GSM Environment (EDGE) and Universal Mobile Telecommunications Service (UMTS) standards. New standards are still being defined, but it is believed that they will have similarities to the network behaviour described herein, and it will also be understood that the device is intended to use any other suitable standards that are developed in the future. The wireless link connecting the communications subsystem 104 with the network 150 represents one or more different Radio Frequency (RF) channels, operating according to defined protocols specified for cdma2000 or GSM/GPRS communications. With the network protocols, these channels are capable of supporting both circuit switched voice communications and packet switched data communications.

The control unit 102 also interacts with additional subsystems such as a Random Access Memory (RAM) 106, a flash memory 108, a display 110, an auxiliary input/output (I/O) subsystem 112, a serial port 114, a keyboard 116, a speaker 118, a microphone 120, a short-range communications unit 122 and other devices 124. Some of these components may be optional depending on the particular type of wireless communications device. Other types of non-volatile storage devices known in the art may be used rather than the flash memory 108. The keyboard 116 may be a telephone-type keypad, an alphanumeric keyboard or some other suitable keypad.

Some of the subsystems of the wireless communications device 100 perform communication-related functions, whereas other subsystems may provide "resident" or on-device functions. By way of example, the display 110 and the keyboard 116 may be used for both communication-related functions, such as entering a text message for transmission over the network 150, and device-resident functions such as a calculator or task list. Operating system software, and other various algorithms, used by the control unit 102 is typically stored in a persistent store such as the flash memory 108, which may alternatively be a read-only memory (ROM) or similar storage element (not shown). Those skilled in the art will appreciate that the operating system, specific device applications, or parts thereof, may be temporarily loaded into a volatile store such as the RAM 106.

The wireless communications device 100 may send and receive communication signals over the network 150 after required network registration or activation procedures have been completed. Network access is associated with a subscriber or user of the wireless communications device 100. To identify a subscriber, the wireless communications device 100 requires a Subscriber Identity Module or "SIM" card 126 or an R-UIM (Removable User Identity Module) to be inserted in a SIM interface 128 (or an R-UIM interface) in order to communicate with the network 150. The SIM card or R-UIM 126 is one type of a conventional "smart card" that is used to identify a subscriber of the wireless communications device 100 and to personalize the wireless communications device 100, among other things. Alternatively, user identification information can also be programmed into flash memory 108. Services may include: web browsing and messaging such as email, voice mail, Short Message Service (SMS), and Multimedia Messaging Services (MMS). More advanced services may include: point of sale, field service and sales force automation.

The wireless communications device 100 is a battery-powered device and includes a battery interface 132 for receiving one or more rechargeable batteries 130. The battery interface 132 is coupled to a regulator (not shown) which assists the battery 130 in providing power V+ to the wireless communications device 100. Although current technology makes use of a battery, future power source technologies such as micro fuel cells may provide the power to the wireless communications device 100.

The control unit 102, in addition to its operating system functions, enables execution of software applications on the wireless communications device 100. A set of applications which control basic device operations, including data and voice communication applications will normally be installed on the wireless communications device 100 during its manufacture. Another application that may be loaded onto the wireless communications device 100 may be a personal information manager (PIM). A PIM has the ability to organize and manage data items of interest to a subscriber, such as, but not limited to, e-mail, calendar events, voice mails, appointments, and task items. A PIM application has the ability to send and receive data items via the wireless network 150. In one embodiment, PIM data items are seamlessly integrated, synchronized, and updated via the wireless network 150 with the wireless communications device subscriber's corresponding data items stored and/or associated with a host computer system. This functionality creates a mirrored host computer on the wireless communications device 100 with respect to such items. This is especially advantageous where the host computer system is the wireless communications device subscriber's office computer system.

Additional applications may also be loaded onto the wireless communications device 100 through the network 150, the auxiliary I/O subsystem 112, the serial port 114, the short-range communications subsystem 122, or any other suitable subsystem 124. This flexibility in application installation increases the functionality of the wireless communications device 100 and may provide enhanced on-device functions, communication-related functions, or both. For example, secure communication applications may enable electronic commerce functions and other such financial transactions to be performed using the wireless communications device 100.

The serial port 114 enables a subscriber to set preferences through an external device or software application and extends the capabilities of the wireless communications device 100 by providing for information or software downloads to the wireless communications device 100 other than through a wireless communication network. The alternate download path may, for example, be used to load an encryption key onto the wireless communications device 100 through a direct and thus reliable and trusted connection to provide secure device communication.

The short-range communications subsystem 122 provides for communication between the wireless communications device 100 and different systems or devices, without the use of the network 150. For example, the subsystem 122 may include an infrared device and associated circuits and components for short-range communication. Examples of short-range communication may include standards developed by the Infrared Data Association (IrDA), Bluetooth, and the 802.11 family of standards developed by IEEE.

In use, a received signal such as a text message, an e-mail message, or web page download will be processed by the communications subsystem 104 and input to the control unit 102. The control unit 102 will then process the received signal for output to the display 110 or alternatively to the auxiliary I/O subsystem 112. A subscriber may also compose data items, such as e-mail messages, for example, using the keyboard 116 in conjunction with display 110 and possibly auxiliary I/O subsystem 112. The auxiliary subsystem 112 may include devices such as: a touch screen, mouse, track ball, infrared fingerprint detector, or a roller wheel with dynamic button pressing capability. The keyboard 116 may be an alphanumeric keyboard and/or telephone-type keypad. A composed item may be transmitted over the network 150 through the communications subsystem 104.

For voice communications, the overall operation of the wireless communications device 100 is substantially similar, except that most of the received signals are output to the speaker 118, and most of the signals for transmission are transduced by microphone 120. Alternative voice or audio I/O subsystems, such as a voice message recording subsystem, may also be implemented on the wireless communications device 100. Although voice or audio signal output is accomplished primarily through the speaker 118, the display 110 may also be used to provide additional information such as the identity of a calling party, duration of a voice call, or other voice call related information.

Figure 2:
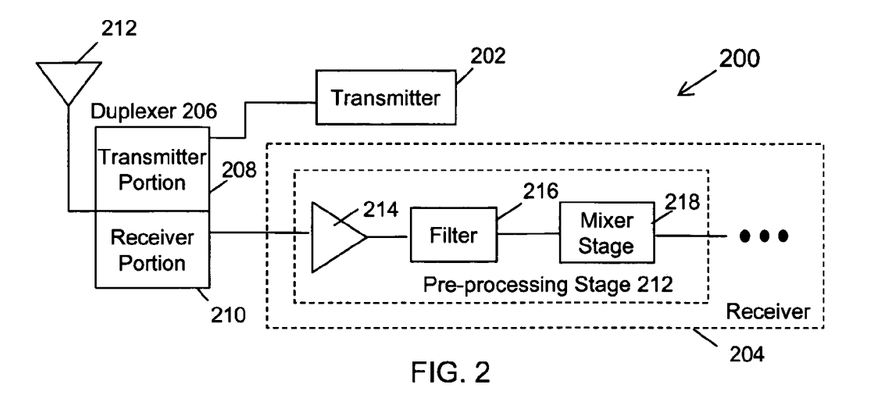
FIG. 2 is a block diagram of an exemplary embodiment of a portion of a transceiver that is conventionally used by the wireless communications device.

Referring now to FIG. 2, shown therein is a block diagram of an exemplary embodiment of a portion of a transceiver 200 that is conventionally used in the communications subsystem 104 of the wireless communications device 100. The transceiver 200 includes a transmitter 202 and a receiver 204 both connected to a duplexer 206. The duplexer 206 has a transmitter duplex portion 208 and a receiver duplex portion 210. The duplexer 206 is connected to an antenna 212. Both signal transmission and reception involve the antenna 212. Structures that are suitable for the transmitter 202, the duplexer 206 and the antenna 212 are commonly known to those skilled in the art and will not be described further.

The pre-processing stage 212 of the receiver 204 typically includes an amplifier 214, a filter 216, and a mixer stage 218 connected as shown. Other receiver components are connected to the receiver pre-processing stage as is commonly known by those skilled in the art. The amplifier 214 is typically a low noise amplifier (LNA) and the filter 216 is typically a band pass or band selection filter. In one embodiment, the filter 216 may be a Surface Acoustic Wave (SAW) filter. However, these components may be implemented using other means as is commonly known by those skilled in the art.

In use, the filter 216 is tuned to pass the received signals of interest to the mixer stage 218 and almost always reflects any unwanted signals. However, in a full duplex topology, some of the transmission energy leaks from the transmitter portion of the duplexer 208 to the receiver portion of the duplexer 210 to the receiver 204 and unfavorable loads may be connected to the amplifier 214 at the transmission frequencies. The net effect is a reflection of transmission signal energy back to the amplifier 214 that causes premature clipping of the output signal of the amplifier 214. The clipping can actually happen at the mixer stage 218 and/or the amplifier 214. For instance, if the filter 216 does not provide enough rejection of the unwanted leaked transmission signal energy, then clipping may occur in the mixer stage 218.

Figure 3:
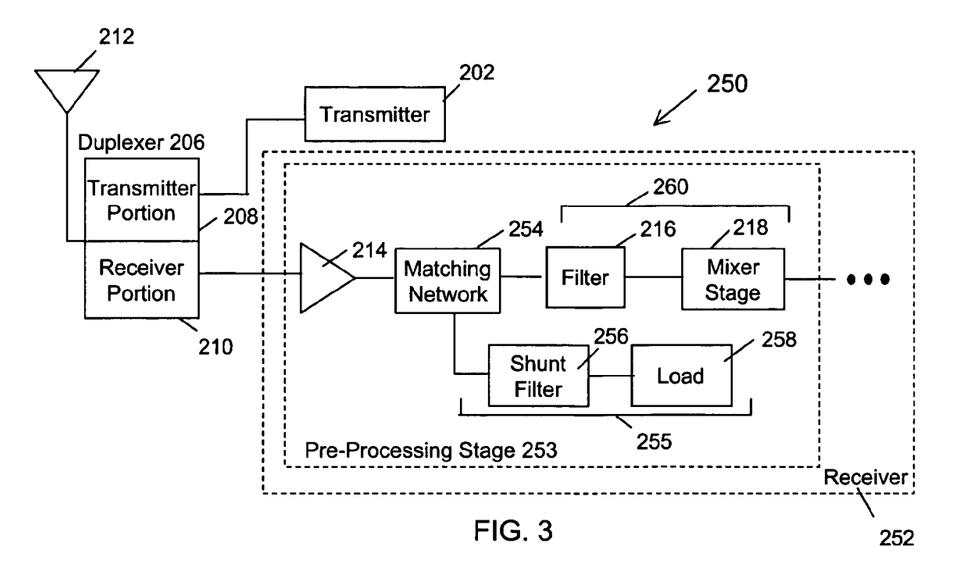
FIG. 3 is a block diagram of an exemplary embodiment of a portion of a transceiver, for use by the wireless communications device, having circuitry for improving linearity of received signals of interest; and, FIG. 4 is a block diagram of an exemplary embodiment of a portion of a transceiver, for use by the wireless communications device, having circuitry for improving linearity of received signals of interest.

Referring now to FIG. 3, shown therein is a block diagram of an exemplary embodiment of a portion of a transceiver 250 for use by the wireless communications device 100. The transceiver 250 is somewhat similar to transceiver 200. However, the transceiver 250 includes a modified receiver 252 in which the pre-processing stage 253 of the receiver 252 includes a matching network 254 between the amplifier 214 and the filter 216 and an additional shunt path 255 that includes a shunt filter 256 and a load 258. The filter 216 and the mixer stage 218 are components in the signal path 260. Conventionally, a matching network may be used to provide an impedance match between the amplifier 214 and the filter 216. However, in accordance with the embodiments described herein, the matching network 254 provides an impedance match between the amplifier 214 and the two filters 216 and 256 in the signal and shunt paths 260 and 255 respectively. The matching network 254 directs unwanted leaked transmission signal energy to the shunt path 255 and directs the received signals of interest to the remainder of the receiver 204. The action of the shunt path 255 at the output of the amplifier 214 essentially clamps the output swing of the amplifier 214 in the frequency band of the unwanted signals by affecting the energy that gets reflected back to the amplifier 214. This improves the third-order intercept point (IP3) of the amplifier 214 since the components of the shunt path 255 provide favorable loads at frequencies at which the maximum signal is present. The IP3 is a figure of merit for linearity or distortion.

In one exemplary implementation, the components of the shunt path 255 may be configured to dissipate the unwanted leaked transmission signal energy which prevents this unwanted energy from reaching the remainder of the receiver 204 and possibly causing the mixer stage 218 to clip. In another exemplary implementation, the components of the shunt path 255 may be configured to reflect the unwanted leaked transmission signal energy with an appropriate phase for canceling out at least a portion of the leaked transmission signal energy at the amplifier 214.

In another exemplary implementation, the components of the shunt path 255, i.e. the shunt filter 256 and the load 258, may further be implemented such that a portion of the unwanted leaked transmission signal energy is dissipated and a portion of this unwanted energy is reflected back towards the amplifier 214 with the appropriate phase for canceling out at least some of the unwanted leaked transmission energy that propagates through the amplifier 214. For each of these implementations, tuning may be done by making measurements of the complete system performance while adjusting the load 258. The phase of the reflection is usually not directly measured since adding probes may disturb the system too much. Rather, a series of test signals may be injected into the system which are expected to compress the amplifier 214 while adjusting the load 258. The tuning is adjusted while observing the degradation in radio sensitivity. Since the additional test signals are chosen to mix noise into the channel of interest when there is non-linear distortion in the stage under test, one can optimize the linearity of the stage by tuning for minimum sensitivity degradation.

The matching network 254 may include several reactive components such as capacitors and inductors. Those skilled in the art will be familiar with various network topologies that can be used to construct the matching network 254. The matching network 254 preferably has a three-port configuration and is designed and adjusted to have minimal impact on the transmission of the received signals of interest to the filter 216 while presenting the correct impedance, in the transmission frequency band, at the output of the amplifier 214 for transmitting the unwanted leaked transmission signal energy to the shunt filter 256 and load 258. In one embodiment, the structure of the matching network 254 is fixed once constructed. In other embodiments, the structure of the matching network 254 and load 258 may be variable to allow the matching network 254 to be tuned depending on the transmission and reception frequencies of the wireless communications device 100. To switch the load 258, one may use a FET switch, a PIN diode and the like. Alternatively, a varactor diode may be used to provide continuous tuning.

The shunt filter 256 requires a certain amount of selectivity to separate the unwanted leaked transmission signal energy from the received signals of interest. Accordingly, the matching network 254 provides a first level of crude separation of the signals but it is the high selectivity of both of the filters 216 and 256 used in conjunction with one another and the matching network 254 that provides the desired separation effect. The S-parameters of the two filters 216 and 256 can be selected together to achieve this effect. The shunt filter 256 may be implemented by any low-loss filter with high reflection in the receiver band. For instance, filters traditionally used in the transmitter portions of transceivers may be used. The shunt filter 256 is preferably implemented using a ceramic or Surface Acoustic Wave (SAW) filter since the Q-factor of the shunt filter is high.

The load 258 may be any suitable reactive load. The load 258 can be adjusted such that the leaked transmission signal energy effectively "sees" a low impedance path at the transmission frequency. The shunt filter 256 "traps" the unwanted leaked transmission signal energy before this energy has a chance to reach the mixer stage 218. This results in an effective reduction of the gain of the amplifier 214 at the transmission frequency. This in turn results in a reduction of distortion in the mixer stage 218 since there is much less power at the input of the mixer stage 218. This improves the two-tone desensitization performance of the transceiver 250 especially in cases in which the mixer stage 218 has mixers that are poorly balanced.

Alternatively, the load 258 can be adjusted so that a desired phase is achieved for any of the unwanted leaked transmission signal energy that is reflected from the input of the shunt filter 256. A correctly phased reflection presented at the output of the amplifier 214 (in the transmission frequency band) will decrease the clipping that may otherwise occur at the output of the amplifier 214 as in conventional designs.

In another alternative embodiment, the load 258 may be designed to provide a tradeoff between the dissipation of the unwanted leaked transmission signal energy and the amount of correctly phased reflection of unwanted leaked transmission signal energy back to the output of the amplifier 214. It has been found through experimentation that reflecting a portion of the unwanted leaked transmission signal energy rather than just dissipating it in the load 258 improves the linearity of the amplifier 214.

In either embodiment, the load 258 may be a fixed load or it may be a variable load that can be adjusted "on-the-fly" depending on the operating frequency. Accordingly, the load 258 may be a frequency dependant load that can be controlled by software executed by the wireless communications device 100.

Figure 4:
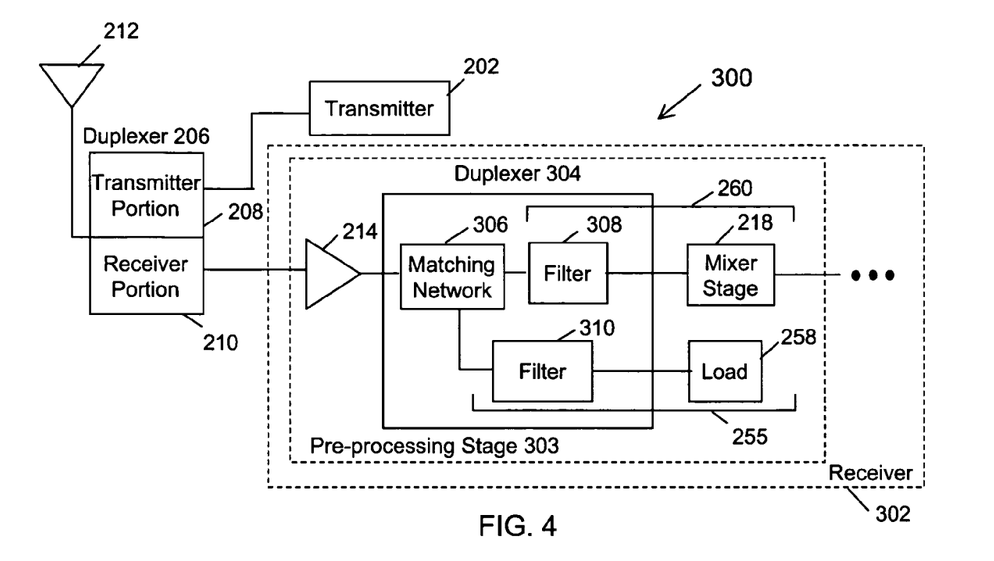

Referring now to FIG. 4, shown therein is an alternative embodiment of a portion of the transceiver 300 that may be used in the communications subsystem 104 of the wireless communications device 100. The transceiver 300 has a receiver 302 with a pre-processing stage 303 that includes an additional duplexer 304 which provides circuitry for a matching network 306, a filter 308 and a second filter 310 which acts as the shunt filter 256. The antenna input/output of the additional duplexer 304 is connected to the output of the input amplifier 214, the receiver output of the additional duplexer 304 is connected to the mixer stage 218 and the transmitter input of the additional duplexer 304 is connected to the load 258. In some cases, the components connected to the transmitter and receiver ports can be reversed although this may affect performance due to the different characteristics of filters 308 and 310.

In this exemplary embodiment of the transceiver 300, the duplexer 206, as in the previous embodiments, is used to separate the transmit and receiver signals while the additional duplexer 304 is used since it conveniently packages two filters and a matching network in a single package that can be used, in a similar fashion to the embodiment of FIG. 3, to improve the linearity of the linear amplifier 214. A convenient feature of transceiver 300 is that the receiver port of the additional duplexer 304 provides a differential signal line, which simplifies connection to the mixer stage 218 since mixers typically require a differential input. The circuitry of the transceiver 300 used in the shunt and signal paths 255 and 260 operate similarly to the shunt and signal path circuitry of transceiver 250.

The additional duplexer 304 provides circuitry for portions of the shunt and signal path in a single package which results in a significant savings in board space. However, the tradeoff is a reduction in the amount of tuning flexibility since there is no longer as much control of the power split between the filters 308 and 310. In contrast, the embodiment of transceiver 250 allows one to easily adjust the matching network 254 which affects the amount of power sent to each filter 216 and 256.

The shunt configuration of the various embodiments described herein provides a selective improvement in the linearity of the amplifier 214 at the transmission frequency by clamping the voltage swing of the output of the amplifier 214 at that frequency. When the load 258 is correctly adjusted there is little effect at the receiver frequency so that the gain and noise factor (NF) of the amplifier 214 are preserved. This has the benefit of improving the single tone performance of the receiver 252 if the receiver 252 is used in CDMA or other duplex systems without the technically difficult task of improving the isolation between the transmitter and receiver portions 208 and 210 of the duplexer 206.

The pre-processing stage of the receiver trades off cost and complexity to achieve good linearity with no degradation of NF for the amplifier used in the receiver portion of the transceiver. For instance, in one exemplary embodiment, a shunt filter and load is used in the receiver portion of the transceiver to "trap" energy from the unwanted leaked transmission signal energy before this energy can reach the mixer stage of the receiver. The shunt filter may be a filter that is typically used in the transmitter portion of the transceiver. It has been found that this configuration allows for an increase in the intermodulation margins of the transceiver without compromising sensitivity.

Another aspect of the embodiments described herein is that the shunt filter and load may be designed so that it reflects a certain amount of the leaked transmission signal back to the output of the receiver amplifier such that the reflected energy is out of phase with respect to the leaked transmission signal that propagated through the amplifier. The optimal reflected phase will vary from design to design. The optimal reflected phase will depend on the full S-parameters of the amplifier 214. In one instance, the optimal phase can be determined experimentally by tuning. By not modifying the input to the receiver amplifier, this configuration provides a low NF for the receiver amplifier while still improving the linearity of the receiver amplifier even though the shunt filter is situated downstream from the amplifier.

In another embodiment, the shunt filter and load may be designed to both dissipate a portion of the leaked transmission signal and reflect a portion of the leaked transmission signal back to the output of the receiver amplifier such that the reflected energy is out of phase with respect to the leaked transmission signal that propagated through the amplifier.

In all three cases, the shunt path is adapted to reduce the voltage swing of the amplifier in the frequency band of the unwanted signals thereby improving the linearity of the amplifier.

In one aspect, at least one embodiment described herein provides a pre-processing stage for a receiver of a wireless device. The pre-processing stage comprises an amplifier that receives signals of interest and unwanted signals and produces amplified signals of interest and amplified unwanted signals of interest; a matching network connected to the amplifier, the matching network being configured for separating the amplified received signals of interest from the amplified unwanted signals in conjunction with additional downstream filters; a signal path connected to the matching network, the signal path including components for receiving and pre-processing the amplified signals of interest; and, a shunt path connected to the matching network, the shunt path including components for adjusting reflected energy sent back to the amplifier for limiting the output swing of the amplifier in a frequency band corresponding to the amplified unwanted signals.

The components of the shunt path may limit the output swing of the amplifier by dissipating at least a portion of the amplified unwanted signals.

In another instance, the components of the shunt path may limit the output swing of the amplifier by reflecting at least a portion of the amplified unwanted signals wherein the reflected unwanted signals are given a phase shift for at least partially canceling the amplified unwanted signals at the output of the amplifier.

In another instance, the components of the shunt path may limit the output swing of the amplifier by dissipating at least a portion of the amplified unwanted signals and reflecting at least a portion of the amplified unwanted signals wherein the reflected unwanted signals are given a phase shift for at least partially canceling the amplified unwanted signals at the output of the amplifier.

The shunt path may include a shunt filter connected to the matching network, the shunt filter being one of the additional downstream filters and having a passband for allowing the amplified unwanted signals of interest to pass therethrough; and, a load connected to the shunt filter, the load having an impedance for at least one of dissipating the amplified unwanted signals and reflecting a portion of the amplified unwanted signals with the phase shift.

The signal path may include a filter connected to the matching network, the filter being one of the additional downstream filters and having a passband for allowing the amplified signals of interest to pass therethrough; and, a mixer stage connected to the filter, the mixer stage being adapted for receiving and demodulating the amplified signals of interest.

In another instance, the pre-processing stage may include a duplexer having an antenna port, a transmitter port and a receiver port, the duplexer further including circuitry for providing the matching network, the filter and the shunt filter, and wherein the amplifier is connected to the antenna port of the duplexer and the mixer stage and the shunt filter are connected to one of the receiver and transmitter ports of the duplexer.

The magnitude and phase of the load may be adjustable during the operation of the pre-processing stage. Further, the matching network may be adjustable during the operation of the pre-processing stage.

In another aspect, at least one embodiment described herein provides a method for improving the linearity in a pre-processing stage of a receiver used in a wireless device. The method comprises:

(a) receiving signals of interest and unwanted signals;

(b) amplifying the signals of interest and the unwanted signals with an amplifier to produce amplified signals of interest and amplified unwanted signals;

(c) using a matching network and additional downstream filters for separating the amplified received signals of interest from the amplified unwanted signals;

(d) using a desired signal path at the output of the matching network with components for receiving and pre-processing the amplified signals of interest; and, (e) using a shunt path at the output of the matching network, in parallel with the signal path, with components for adjusting reflected energy sent back to the amplifier for limiting the output swing of the amplifier in a frequency band corresponding to the amplified unwanted signals.

In one instance, (c) may include limiting the output swing of the amplifier by dissipating the amplified unwanted signals.

In another instance, (c) may include limiting the output swing of the amplifier by reflecting at least a portion of the amplified unwanted signals wherein the reflected unwanted signals are given a phase shift for at least partially canceling the unwanted signals at the output of the amplifier.

In another instance, (c) may include limiting the output swing of the amplifier by dissipating a portion of the amplified unwanted signals and reflecting a portion of the amplified unwanted signals wherein the reflected unwanted signals are given a phase shift for at least partially canceling the amplified unwanted signals at the output of the amplifier.

In another instance, (c) may further include using a shunt filter in the shunt path, the shunt filter being connected to the matching network, the shunt filter being one of the additional downstream filters and having a passband for allowing the amplified unwanted signals of interest to pass therethrough; and, using a load in the shunt path, the load being connected to the shunt filter, the load having an impedance for at least one of dissipating the amplified unwanted signals and reflecting the portion of the amplified unwanted signals with a phase shift for at least partially canceling the amplified unwanted signals at the output of the amplifier.

In another instance, (c) may further include adjusting the magnitude and phase of the load during the operation of the pre-processing stage.

In another instance, (c) may further include adjusting the matching network during the operation of the pre-processing stage.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

It should be understood that various modifications can be made to the embodiments described and illustrated herein, without departing from the embodiments, the general scope of which is defined in the appended claims.

The invention claimed is:

1. A pre-processing stage for a receiver of a wireless device, wherein the pre-processing stage comprises:
   a) an amplifier that receives signals of interest and unwanted signals and provides amplified signals of interest and amplified unwanted signals;
   b) a matching network connected to the amplifier, the matching network being configured for separating the amplified received signals of interest from the amplified unwanted signals in conjunction with additional downstream filters;
   c) a signal path connected to the matching network, the signal path including components for receiving and pre-processing the amplified signals of interest; and,
   d) a shunt path connected to the matching network, the shunt path including components for adjusting reflected energy sent back to the amplifier for limiting the output swing of the amplifier in a frequency band corresponding to the amplified unwanted signals.

2. The pre-processing stage of claim 1, wherein the components of the shunt path limit the output swing of the amplifier by dissipating at least a portion of the amplified unwanted signals.

3. The pre-processing stage of claim 1, wherein the components of the shunt path limit the output swing of the amplifier by reflecting at least a portion of the amplified unwanted signals with a phase shift for at least partially canceling the amplified unwanted signals at the output of the amplifier.

4. The pre-processing stage of claim 1, wherein the components of the shunt path limit the output swing of the amplifier by dissipating at least a portion of the amplified unwanted signals and reflecting at least a portion of the amplified unwanted signals with a phase shift for at least partially canceling the amplified unwanted signals at the output of the amplifier.

5. The pre-processing stage of claim 1, wherein the shunt path includes:

e) a shunt filter connected to the matching network, the shunt filter being one of the additional downstream filters and having a passband for allowing the amplified unwanted signals of interest to pass therethrough; and, f) a load connected to the shunt filter, the load having an impedance for at least one of dissipating the amplified unwanted signals and reflecting the portion of the amplified unwanted signals with the phase shift.

6. The pre-processing stage of claim 5, wherein the signal path includes:

g) a filter connected to the matching network, the filter being one of the additional downstream filters and having a passband for allowing the amplified signals of interest to pass therethrough; and, h) a mixer stage connected to the filter, the mixer stage being adapted for receiving and demodulating the amplified signals of interest.

7. The pre-processing stage of claim 6, wherein the pre-processing stage includes a duplexer having an antenna port, a transmitter port and a receiver port, the duplexer further includes circuitry for providing the matching network, the filter and the shunt filter, and wherein the amplifier is connected to the antenna port of the duplexer and the mixer stage and the shunt filter are connected to one of the receiver and transmitter ports of the duplexer.

8. The pre-processing stage of claim 5, wherein the magnitude and phase of the load is adjustable during the operation of the pre-processing stage.

9. The pre-processing stage of claim 5, wherein the matching network is adjustable during the operation of the pre-processing stage.

10. A method for improving the linearity in a pre-processing stage of a receiver used in a wireless device, the method comprising:

a) receiving signals of interest and unwanted signals;

b) amplifying the signals of interest and the unwanted signals with an amplifier to generate amplified signals of interest and amplified unwanted signals;

c) using a matching network and additional downstream filters for separating the amplified received signals of interest from the amplified unwanted signals;

d) using a desired signal path at the output of the matching network with components for receiving and pre-processing the amplified signals of interest; and, e) using a shunt path at the output of the matching network, in parallel with the signal path, with components for adjusting reflected energy sent back to the amplifier for limiting the output swing of the amplifier in a frequency band corresponding to the amplified unwanted signals.

11. The method of claim 10, wherein (e) includes limiting the output swing of the amplifier by dissipating the amplified unwanted signals.

12. The method of claim 10, wherein (e) includes limiting the output swing of the amplifier by reflecting at least a portion of the amplified unwanted signals with a phase shift for at least partially canceling the amplified unwanted signals at the output of the amplifier.

13. The method of claim 10, wherein (e) includes limiting the output swing of the amplifier by dissipating a portion of the amplified unwanted signals and reflecting a portion of the amplified unwanted signals with a phase shift for at least partially canceling the amplified unwanted signals at the output of the amplifier.

14. The method of claim 10, wherein (e) includes using a shunt filter in the shunt path, the shunt filter being connected to the matching network, the shunt filter being one of the additional downstream filters and having a passband for allowing the amplified unwanted signals of interest to pass therethrough; and, using a load in the shunt path, the load being connected to the shunt filter, the load having an impedance for at least one of dissipating the amplified unwanted signals and reflecting the portion of the amplified unwanted signals with a phase shift for at least partially canceling the amplified unwanted signals at the output of the amplifier.

15. The method of claim 14, wherein (e) includes adjusting the magnitude and phase of the load during the operation of the pre-processing stage.

16. The method of claim 14, wherein (e) includes adjusting the matching network during the operation of the pre-processing stage.

* * * * *